US012568690B2

(12) United States Patent
    Cao et al.

(10) Patent No.: US 12,568,690 B2
(45) Date of Patent: Mar. 3, 2026

(54) ARRAY SUBSTRATE AND CONTROL METHOD THEREOF, MANUFACTURING METHOD THEREOF AND ELECTRONIC PAPER DISPLAY DEVICE

(71) Applicant: HKC CORPORATION LIMITED, Shenzhen (CN)

(72) Inventors: Junhong Cao, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 359 days.

(21) Appl. No.: 18/352,515

(22) Filed: Jul. 14, 2023

(65) Prior Publication Data

US 2024/0136365 A1     Apr. 25, 2024
US 2024/0234437 A9     Jul. 11, 2024

(30) Foreign Application Priority Data

Oct. 21, 2022    (CN) .......................... 202211299987.2

(51) Int. Cl.
*H10D 86/60*        (2025.01)
*G02F 1/133*        (2006.01)
            (Continued)

(52) U.S. Cl.
CPC ......... *H10D 86/60* (2025.01); *G02F 1/13312* (2021.01); *G02F 1/1368* (2013.01);
            (Continued)

(58) Field of Classification Search
CPC .... H10D 86/60; H10D 86/021; H10D 86/441; G02F 1/13312; G02F 1/1368;
            (Continued)

(56) References Cited

U.S. PATENT DOCUMENTS

2010/0033804 A1    2/2010  Aoki
2018/0226512 A1*   8/2018  Nakano ................ H10D 86/441
            (Continued)

FOREIGN PATENT DOCUMENTS

CN        1831902 A      9/2006
CN      101151651 A      3/2008
            (Continued)

OTHER PUBLICATIONS

First Office Action issued in counterpart Chinese Patent Application No. 202211299987.2, dated May 23, 2023.
            (Continued)

*Primary Examiner* — Charles S Chang
(74) *Attorney, Agent, or Firm* — Westbridge IP LLC

(57) ABSTRACT

Disclosed are an array substrate, a control method thereof, a manufacturing method thereof and an electronic paper display device. The array substrate includes a substrate and a plurality of thin film transistors provided on the substrate and a plurality of pixel electrode structures, each thin film transistor includes an active layer, a source and a drain, a conductive channel is provided between the source and the drain and is provided on the active layer, a plurality of pixel electrode structures each is provided on a side of each thin film transistor away from the substrate, each pixel electrode structure includes a first pixel electrode and a second pixel electrode spaced from each other, the first pixel electrode corresponds to the conductive channel and connected to a voltage line, and the second pixel electrode is connected to the drain through a conductive through hole.

3 Claims, 5 Drawing Sheets

(51) Int. Cl.

| | | |
|---|---|---|
| *G02F 1/1368* | (2006.01) |
| *G02F 1/167* | (2019.01) |
| *G02F 1/16766* | (2019.01) |
| *G02F 1/1685* | (2019.01) |
| *H10D 86/01* | (2025.01) |
| *H10D 86/40* | (2025.01) |

(52) U.S. Cl.
CPC .......... *G02F 1/167* (2013.01); *G02F 1/16766* (2019.01); *G02F 1/1685* (2019.01); *H10D 86/021* (2025.01); *H10D 86/441* (2025.01); *G02F 2201/50* (2013.01)

(58) Field of Classification Search
CPC .... G02F 1/167; G02F 1/16766; G02F 1/1685; G02F 2201/50; G02F 1/1675; G02F 1/16755; G02F 1/1676
See application file for complete search history.

(56) References Cited

U.S. PATENT DOCUMENTS

| | | | | |
|---|---|---|---|---|
| 2019/0056616 A1* | 2/2019 | Wang | ................ | G02F 1/134336 |
| 2021/0349340 A1* | 11/2021 | Hara | ................ | G02F 1/133345 |

FOREIGN PATENT DOCUMENTS

| | | | |
|---|---|---|---|
| CN | 101393370 | A | 3/2009 |
| CN | 101740605 | A | 6/2010 |
| CN | 103762223 | A | 4/2014 |
| CN | 104658464 | A | 5/2015 |
| CN | 114089578 | A | 2/2022 |
| CN | 115509056 | A | 12/2022 |
| JP | 2001215529 | A | 8/2001 |
| JP | 2011232525 | A | 11/2011 |
| JP | 2016136176 | A | 7/2016 |
| KR | 20140142064 | A | 12/2014 |
| WO | 2022193239 | A1 | 9/2022 |

OTHER PUBLICATIONS

International Search Report and Written Opinion issued in counterpart PCT Application No. PCT/CN2023/102213, dated Sep. 26, 2023.
Second Office Action issued in counterpart Chinese Patent Application No. 202211299987.2, dated Aug. 21, 2023.

* cited by examiner

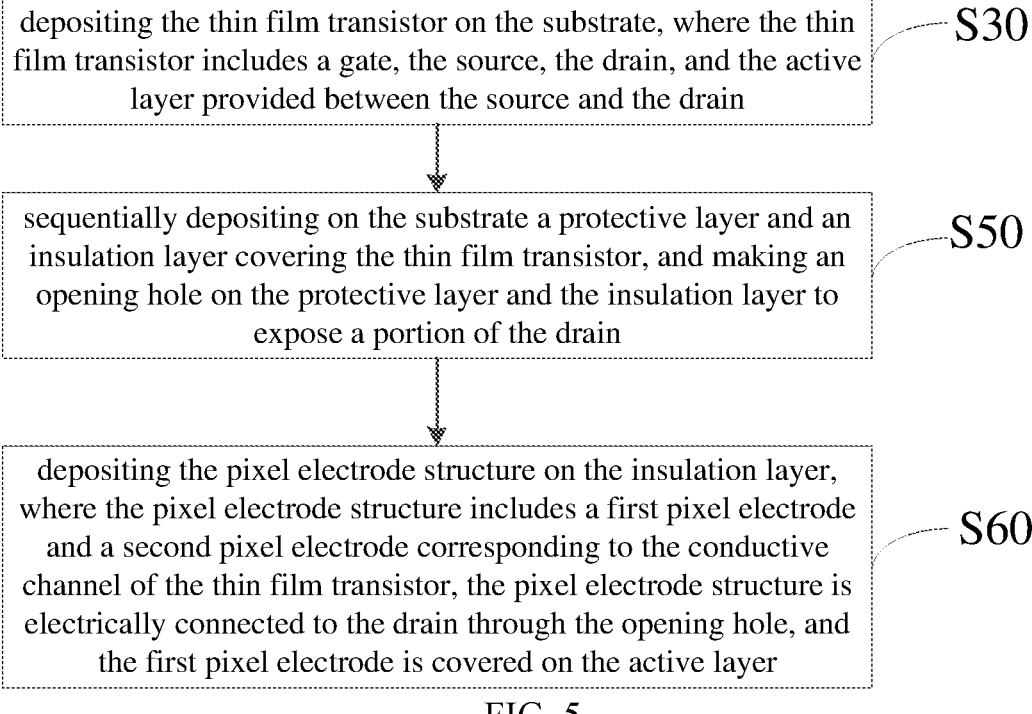

depositing the thin film transistor on the substrate, where the thin film transistor includes a gate, the source, the drain, and the active layer provided between the source and the drain ⟍ S30 sequentially depositing on the substrate a protective layer and an insulation layer covering the thin film transistor, and making an opening hole on the protective layer and the insulation layer to expose a portion of the drain ⟍ S50 depositing the pixel electrode structure on the insulation layer, where the pixel electrode structure includes a first pixel electrode and a second pixel electrode corresponding to the conductive channel of the thin film transistor, the pixel electrode structure is electrically connected to the drain through the opening hole, and the first pixel electrode is covered on the active layer ⟍ S60

FIG. 5

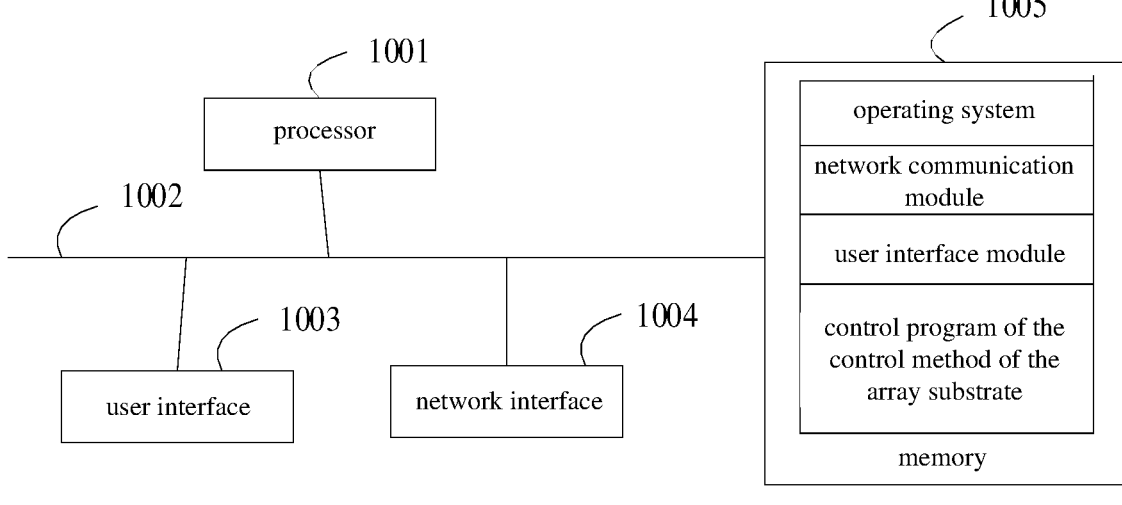

FIG. 6

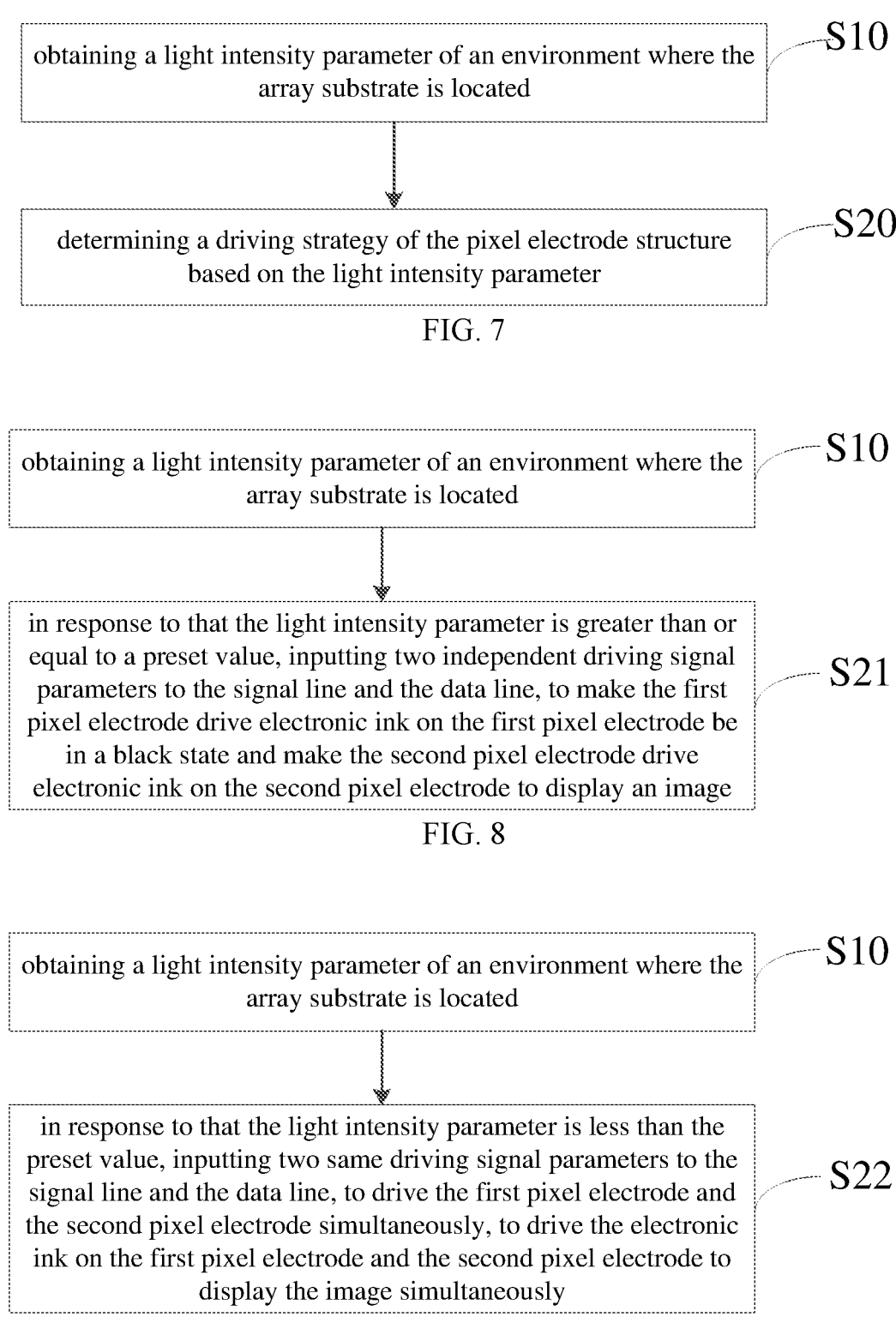

obtaining a light intensity parameter of an environment where the array substrate is located ⟋S10 determining a driving strategy of the pixel electrode structure based on the light intensity parameter ⟋S20

FIG. 7 obtaining a light intensity parameter of an environment where the array substrate is located ⟋S10 in response to that the light intensity parameter is greater than or equal to a preset value, inputting two independent driving signal parameters to the signal line and the data line, to make the first pixel electrode drive electronic ink on the first pixel electrode be in a black state and make the second pixel electrode drive electronic ink on the second pixel electrode to display an image ⟋S21

FIG. 8 obtaining a light intensity parameter of an environment where the array substrate is located ⟋S10 in response to that the light intensity parameter is less than the preset value, inputting two same driving signal parameters to the signal line and the data line, to drive the first pixel electrode and the second pixel electrode simultaneously, to drive the electronic ink on the first pixel electrode and the second pixel electrode to display the image simultaneously ⟋S22

FIG. 9 obtaining a light intensity parameter of an environment where the array substrate is located          ⌐ S10 in response to that the light intensity parameter is less than the preset value, loading no driving signal on the signal line          ⌐ S23

ARRAY SUBSTRATE AND CONTROL METHOD THEREOF, MANUFACTURING METHOD THEREOF AND ELECTRONIC PAPER DISPLAY DEVICE

CROSS-REFERENCE TO RELATED APPLICATIONS

This application claims priority to Chinese Patent Application No. 202211299987.2, filed on Oct. 21, 2022, the entire contents of which are incorporated herein by reference.

TECHNICAL FIELD

The present application relates to the field of an electronic paper, and in particular to an array substrate and a control method thereof, a manufacturing method thereof and an electronic paper display device.

BACKGROUND

At present, the electronic paper display mainly includes the opposite substrate, an electronic ink layer (display medium) and a lower substrate (array substrate), and usually adopts a bottom grid anti-interlacing laminated structure, is formed by a direct bonding of the opposite substrate coated with electrophoretic particles with the array substrate, displays the bright state mainly through white pigment particles with a great reflective ability in the electronic ink layer, and displays the dark state to display the image through the black particles with a good absorption ability in the electronic ink layer. Since an active electronic paper display does not require a backlight, the array substrate that drives the active electronic paper display can be of a reflective design. The typical structure of the existing array substrate includes a substrate. The substrate is formed with data lines and gate lines that are intersected. The data lines and gate lines are enclosed to form pixel cells arranged in matrix, each pixel cell includes a thin film transistor (TFT) switch and a pixel electrode. The TFT switch includes a gate electrode, a source electrode, and a drain electrode. The gate electrode is connected to the gate line, the source electrode is connected to the data line, the drain electrode is connected to the pixel electrode, and the active layer is formed between the source and drain electrodes and the gate electrode. However, because the channel in the TFT area on the array substrate cannot be shielded from the irradiation of external ambient light transmitted from the electrophoretic layer, a larger leakage current is generated, resulting in a cross-talk and reducing a contrast rate of the electronic paper display during display. To solve the above problems, the related art proposes to add light-shielding layers on the array substrate to shield the channel in the TFT area and absorb the ambient light transmitted from the electrophoretic layer to avoid leakage currents in the channel. However, the solution requires the additional light-shielding layer, which will increase the difficulty of the manufacturing process and increase the cost of the array substrate.

SUMMARY

The main purpose of the present application is to propose an array substrate and a control method thereof, a manufacturing method thereof and an electronic paper display device, aiming to solve the problem of how to prevent the external light from irradiating into the conductive channel of thin film transistors without additional light-shielding structures.

In order to achieve the above purpose, the present application provides an array substrate, applied on an electronic paper display device, including: a substrate; a plurality of thin film transistors provided on the substrate, each thin film transistor comprising an active layer, a source and a drain, a conductive channel being provided between the source and the drain and being provided on the active layer; and a plurality of pixel electrode structures provided on a side of the thin film transistors away from the substrate, each pixel electrode structure includes a first pixel electrode and a second pixel electrode spaced from each other, the first pixel electrode corresponds to the conductive channel and is connected to a signal line, and the second pixel electrode is connected to the drain through a conductive through hole.

In an embodiment, the first pixel electrode is made of a transparent conductive material.

In an embodiment, a distance between the first pixel electrode and the second pixel electrode is L, wherein L is greater than or equal to 4 μm, and less than or equal to 6 μm.

In an embodiment, two adjacent thin film transistors are provided in proximity, and two adjacent first pixel electrodes are merged to be formed integratedly.

In an embodiment, the method further includes: a protective layer; and a flat layer, the protective layer is provided on the side of each thin film transistor away from the substrate and the flat layer is provided on a side of the protective layer away from the substrate.

The present application also provides a control method based on the array substrate, including:

obtaining a light intensity parameter of an environment where the array substrate is located; and determining a driving strategy of the pixel electrode structure based on the light intensity parameter.

In an embodiment, the drain is connected to a data line through the active layer, the determining the driving strategy of the pixel electrode structure based on the light intensity parameter includes:

in response to that the light intensity parameter is greater than or equal to a preset value, inputting two independent driving signal parameters to the signal line and the data line, to make the first pixel electrode drive electronic ink on the first pixel electrode to be in a black state and make the second pixel electrode drive electronic ink on the second pixel electrode to display an image; and in response to that the light intensity parameter is less than the preset value, inputting two same driving signal parameters to the signal line and the data line, to drive the first pixel electrode and the second pixel electrode simultaneously, to drive the electronic ink on the first pixel electrode and the second pixel electrode to display the image simultaneously.

In an embodiment, the drain is connected to a data line through the active layer, the determining the driving strategy of the pixel electrode structure based on the light intensity parameter includes:

in response to that the light intensity parameter is greater than or equal to a preset value, inputting two independent driving signal parameters to the signal line and the data line, to make the first pixel electrode drive electronic ink on the first pixel electrode be in a black state and make the second pixel electrode to drive electronic ink on the second pixel electrode to display an image; and in response to that the light intensity parameter is less than the preset value, loading no driving signal on the signal line.

The present application also provides a manufacturing method of the array substrate, including:

depositing the thin film transistor on the substrate. The thin film transistor comprises a gate, the source, the drain, and the active layer provided between the source and the drain;

sequentially depositing on the substrate a protective layer and an insulation layer covering the thin film transistor, and making an opening hole on the protective layer and the insulation layer expose a portion of the drain; and depositing the pixel electrode structure on the insulation layer. The pixel electrode structure includes a first pixel electrode and a second pixel electrode corresponding to the conductive channel of the thin film transistor, the pixel electrode structure is electrically connected to the drain through the opening hole, and the first pixel electrode is covered on the active layer.

In addition, the present application also provides an electronic paper display device, including: the array substrate as mentioned-above.

In the technical solution of the present application, the first pixel electrode and the second pixel electrode provided on the same layer are spaced from each other and are respectively connected to different signal lines to respectively control the first pixel electrode and the second pixel electrode, to avoid the first pixel and the second pixel electrode from influencing each other, thus to respectively control the electrophoresis of charged particles in the electrophoretic layer on the array substrate, and the first pixel electrode is provided correspondingly on the conductive channel to shield the conductive channel and prevent the external light transmitted from the electrophoretic layer from irradiating the conductive channel, so that the first pixel electrode and the second pixel electrode provided on the same layer and separated from each other can avoid the first pixel electrode and the second pixel electrode from influencing each other, to separately control the first pixel electrode to shield the conductive channel, so that the array substrate can not only drive the electrophoretic layer, but also cover the conductive channel of the thin film transistor, to avoid the leakage current of the thin film transistor to become large due to the external light irradiating the conductive channel, so that the array substrate can shield the external light from irradiating the conductive channel without additional light-shielding structure, thus to simplify the manufacturing process and save manufacturing cost.

BRIEF DESCRIPTION OF THE DRAWINGS

In order to more clearly illustrate the technical solutions in the embodiments of the present application or related art, the following is a brief description of the drawings in the description of the embodiments or related art, it is obvious that the drawings in the following description are only some of the embodiments of the present application, other structures can be obtained by those skilled in the art according to the structure shown in these drawings without any creative labor.

FIG. 5 is a flowchart of a manufacturing method of an array substrate according to an embodiment of the present application.

FIG. 6 is a schematic structural view of a controller for the hardware operating environment according to the embodiment of FIG. 1.

FIG. 7 is a flowchart of a control method of the array substrate according to a first embodiment of the present application.

FIG. 8 is a flowchart of the control method of the array substrate according to a second embodiment of the present application.

FIG. 9 is a flowchart of the control method of the array substrate according to a third embodiment of the present application.

Figure 1:
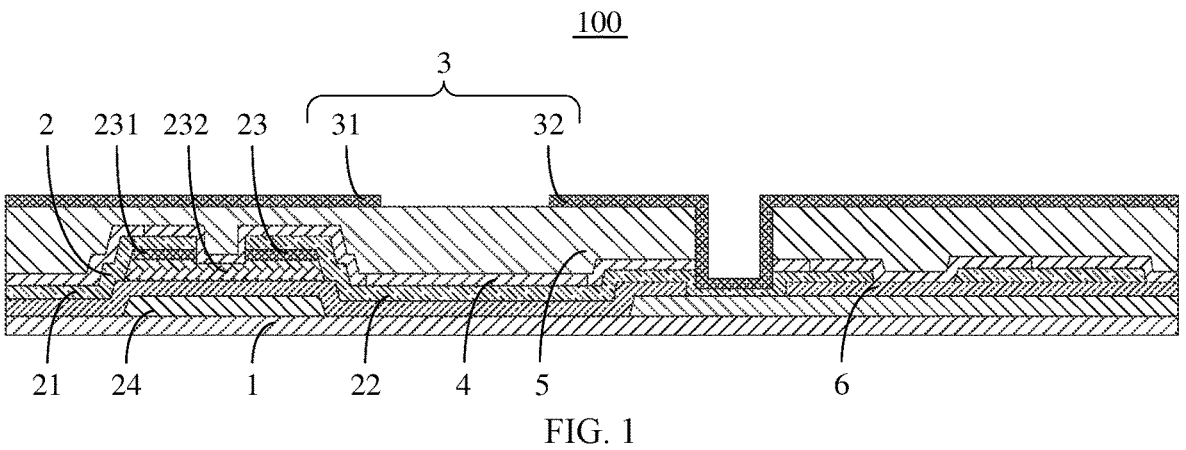
FIG. 1 is a cross-sectional view of an array substrate according to an embodiment of the present application.

The achievement of the purpose, function characteristics and advantages of the present application are further described with respect to the drawings in conjunction with the embodiments.

DETAILED DESCRIPTION OF THE EMBODIMENTS

The technical solutions in the embodiments of the present application will be clearly and completely described below in conjunction with the accompanying drawings in the embodiments of the present application. Obviously, the described embodiments are only some of the embodiments of the present application, and not all of them. Based on the embodiments in the present application, all other embodiments obtained by those skilled in the art without any creative labor fall within the scope of the present application.

It should be noted that if there is a directional indication in an embodiment of the present application, the directional indication is used only to explain the relative position relationship between the components in a particular attitude, the movement, etc., and if the particular attitude is changed, the directional indication is changed accordingly.

In addition, if there are descriptions such as "first" and "second", etc. in the present application, the descriptions such as "first" and "second" are for descriptive purposes only and are not to be understood as indicating or implying their relative importance or implicitly specifying the number of technical features indicated. Thus, the features defined with "first" and "second" may explicitly or implicitly include at least one such feature. In addition, the technical solution of each embodiment can be combined with each other, but only on the basis that they can be achieved by those skilled in the art, when the combination of technical solutions appear to contradict with each other or can not be achieved, it should be considered that the combination of technical solutions does not exist, and is not within the scope of the present application.

At present, the electronic paper display mainly includes the opposite substrate, an electronic ink layer (display medium) and a lower substrate (array substrate), and usually adopts a bottom grid anti-interlacing laminated structure, is formed by a direct bonding of the opposite substrate coated with electrophoretic particles with the array substrate, displays the bright state mainly through white pigment particles with a great reflective ability in the electronic ink layer, and displays the dark state to display the image through the black particles with a good absorption ability in the electronic ink layer. Since an active electronic paper display does not require a backlight, the array substrate that drives the active electronic paper display can be of a reflective design. The typical structure of the existing array substrate includes a substrate. The substrate is formed with data lines and gate lines that are intersected. The data lines and gate lines are enclosed to form pixel cells arranged in matrix, each pixel cell includes a thin film transistor (TFT) switch and a pixel electrode. The TFT switch includes a gate electrode, a source electrode, and a drain electrode. The gate electrode is connected to the gate line, the source electrode is connected to the data line, the drain electrode is connected to the pixel electrode, and the active layer is formed between the source and drain electrodes and the gate electrode. However, because the channel in the TFT area on the array substrate cannot be shielded from the irradiation of external ambient light transmitted from the electrophoretic layer, a larger leakage current is generated, resulting in a cross-talk and reducing a contrast rate of the electronic paper display during display. To solve the above problems, the related art proposes to add light-shielding layers on the array substrate to shield the channel in the TFT area and absorb the ambient light transmitted from the electrophoretic layer to avoid leakage currents in the channel. However, the solution requires the additional light-shielding layer, which will increase the difficulty of the manufacturing process and increase the cost of the array substrate.

Figure 2:
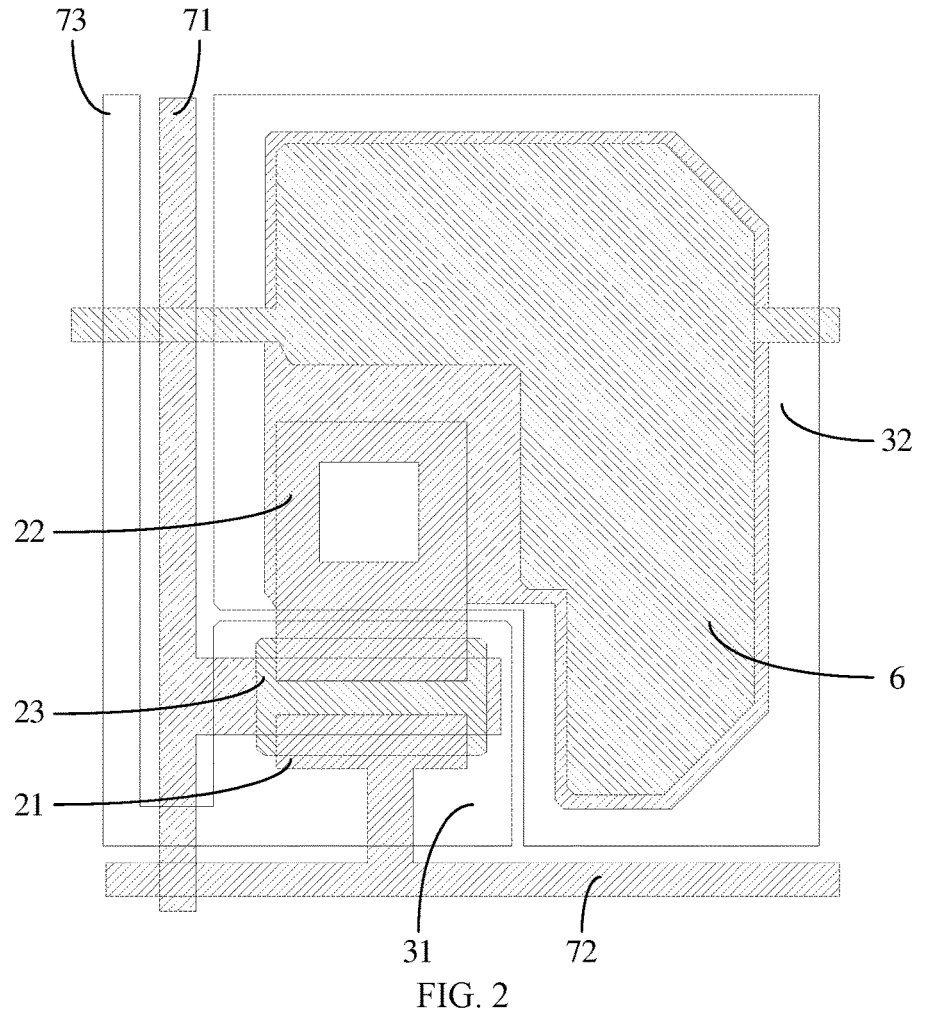
FIG. 2 is a top view of a first pixel electrode in FIG. 1 according to an embodiment of the present application.
Figure 3:
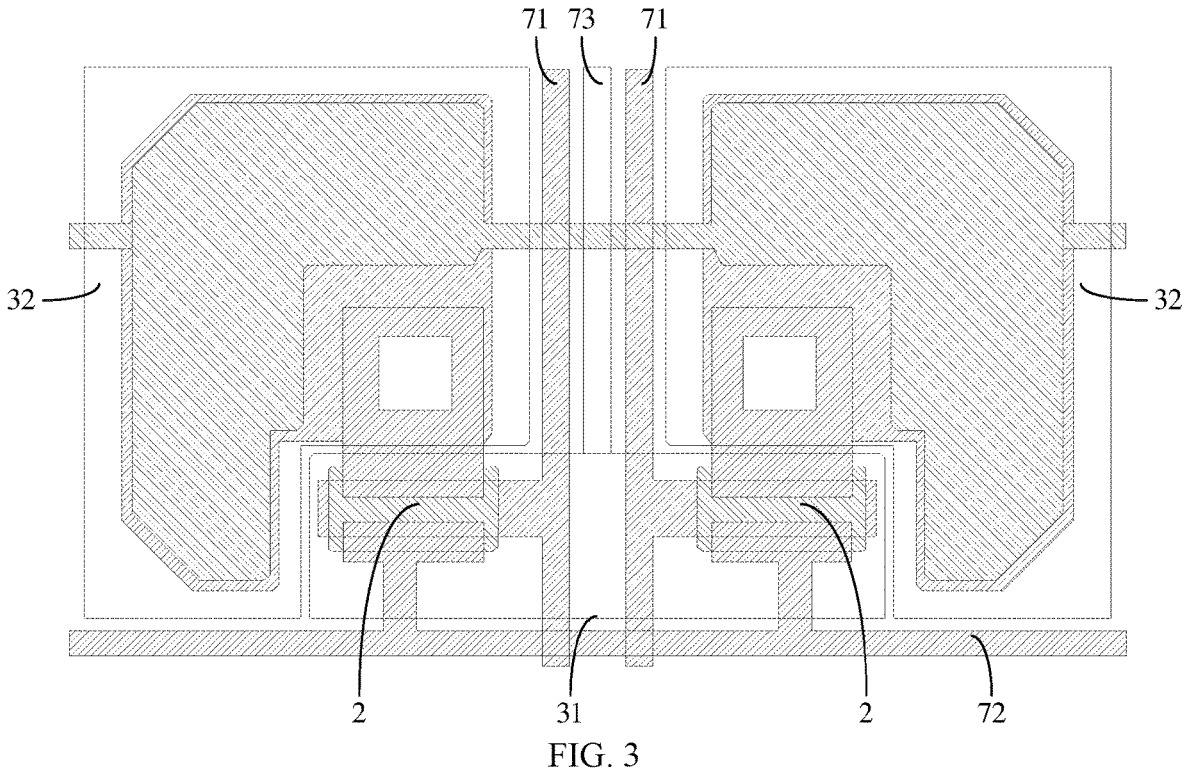
FIG. 3 is a top view of the first pixel electrode in FIG. 1 according to another embodiment of the present application.
Figure 4:
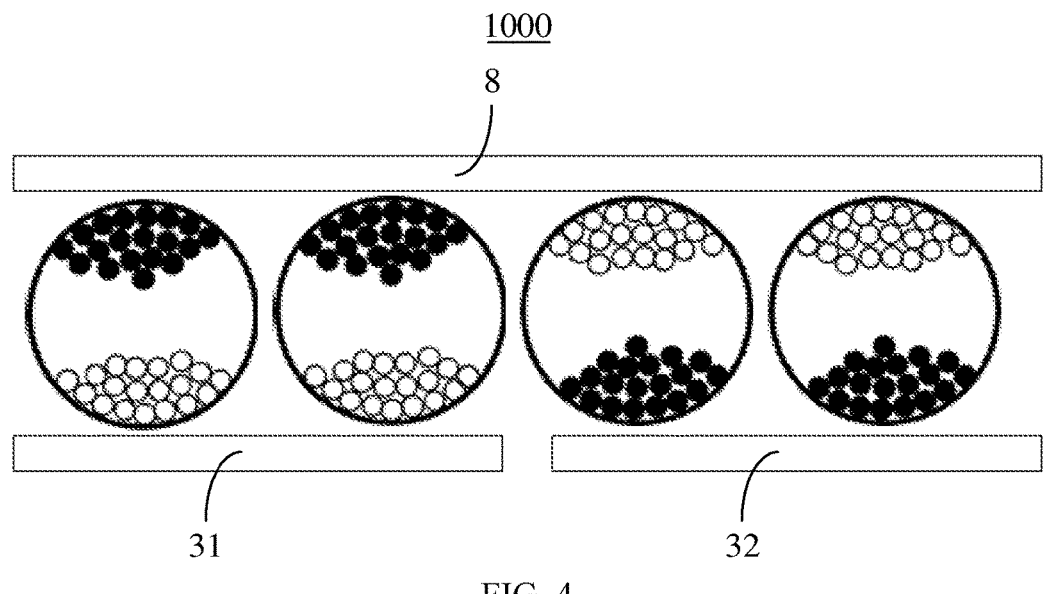
FIG. 4 is a schematic structural view of an electronic paper display device according to an embodiment of the present application.

Based on the above, the present application provides an array substrate, aiming to solve the problem of how to prevent the external light from irradiating into the conductive channel of the thin film transistor without an additional light-shielding structure. FIGS. 1 to 3 are schematic structural views of an array substrate according to embodiments of the present application, and FIG. 4 is a schematic structural view of an electronic paper display device according to an embodiment of the present application. FIG. 5 is a flowchart of a manufacturing method of the array substrate according to an embodiment of the present application. FIGS. 6 to 10 are schematic diagrams of a control method of the array substrate and a storage medium according to an embodiment of the present application.

Referring to FIGS. 1 and 2, the array substrate 100 includes a substrate 1, a plurality of thin film transistors 2, and a plurality of pixel electrode structures 3, a plurality of the thin film transistors 2 are provided on the substrate 1. Each thin film transistor 2 includes an active layer 23, a source 21, and a drain 22, a conductive channel is provided between the source 21 and the drain 22 and is provided on the active layer 23. Each of a plurality of the pixel electrode structure 3 is provided on a side of the thin film transistor 2 away from the substrate 1, each pixel electrode structure 3 includes a first pixel electrode 31 and a second pixel electrode 32 spaced from each other. The first pixel electrode 31 corresponds to the conductive channel and is connected to a voltage line, and the second pixel electrode 32 is connected to the drain 22 through a conductive through hole.

In the technical solution of the present application, the first pixel electrode 31 and the second pixel electrode 32 provided on the same layer are spaced from each other and are respectively connected to different signal lines to respectively control the first pixel electrode 31 and the second pixel electrode 32, to avoid the first pixel electrode 31 and the second pixel electrode 32 from influencing each other, thus to respectively control the electrophoresis of charged particles in the electrophoretic layer on the array substrate 100, and the first pixel electrode 31 is provided correspondingly on the conductive channel to shield the conductive channel and prevent the external light transmitted from the electrophoretic layer from irradiating the conductive channel, so that the first pixel electrode 31 and the second pixel electrode 32 provided on the same layer and separated from each other can avoid the first pixel electrode 31 and the second pixel electrode 32 from influencing each other, to separately control the first pixel electrode 31 to shield the conductive channel, so that the array substrate 100 can not only drive the electrophoretic layer, but also cover the conductive channel of the thin film transistor 2, to avoid the leakage current of the thin film transistor to become large due to the external light irradiating the conductive channel, so that the array substrate 100 can shield the external light from irradiating the conductive channel without additional light-shielding structures, thus to simplify the manufacturing process and save manufacturing costs.

It is to be noted that the substrate 1 is further provided with a plurality of scan lines 71 and a plurality of data lines 72, the scan lines 71 and the data lines 72 intersect with each other to form a plurality of pixel areas, each pixel area is at least provided with one thin film transistor 2, the thin film transistor 2 further includes a gate 24 provided on the substrate 1, the gate 24 is connected to the scan line 71, and the source 21 is connected to the data line. In order to enable control of the voltages of the first pixel electrode 31 and the second pixel electrode 32 respectively, referring to FIG. 2, the array substrate 100 includes a signal line 73, the signal line 73 is connected to the first pixel electrode 31.

It should be understood that in order to control the array substrate to drive electrophoresis of charged particles within the electronic ink, the array substrate further includes a controller, shown in FIG. 6, the controller may include a processor 1001, such as a CPU, a communication bus 1002, a user interface 1003, a network interface 1004, a memory 1005. The communication bus 1002 is used to implement communication among these components. The user interface 1003 may include a display, an input unit such as a keyboard, and the user interface 1003 may also include a standard wired interface, a wireless interface. The network interface 1004 can include a standard wired interface, a wireless interface (such as WI-FI interface). The memory 1005 can be a high-speed RAM memory, or a non-volatile memory, such as a disk memory. The memory 1005 may also be a storage device independent of the aforementioned processor 1001.

In an embodiment, the first pixel electrode 31 may be a transparent conductive material or an opaque conductive material, etc., which is not limited in the present application, The opaque conductive metal material includes aluminum (AL), copper-aluminum alloy (ALCu), aluminum-neodymium alloy (ALNd), silver (Ag), molybdenum (Mo) and other light-shielding metal materials with reflective ability to reflect light and avoid light from irradiating the conductive channel of the thin film transistor 2, but because the pixel electrode structure 3 manufactured by the metal material in the array substrate 100 will be directly exposed to the air, resulting in the pixel electrode structure 3 being easily corroded and scratched, thus in the embodiment, the first pixel electrode 31 is made of the materials include a transparent conductive material, so that the use of transparent conductive material can avoid the pixel electrode structure 3 from being corroded and being scratched, and the transparent conductive material includes indium tin oxide (ITO), etc.

It should be noted that, referring to FIG. 4, when the first pixel electrode 31 is a transparent conductive material, the aggregation of charged particles in the electrophoretic layer is adjusted by adjusting the voltage of the first pixel electrode 31 and the voltage of the opposite substrate in the electronic paper display device 1000, so that the microcapsules in the electrophoretic layer on the first pixel electrode 31 are always in the black state, to shield the light. The transparent conductive material, driven by the signal line, drives the electronic ink on the first pixel electrode to be in the black state to avoid light from irradiating the conductive channel of the thin film transistor 2.

In theory, the first pixel electrode 31 can be made of the same material as the second pixel electrode 32, or, the first pixel electrode 31 can be made of different material from the second pixel electrode 32, which is not limited in the present application. In the embodiment, the second pixel electrode 32 is made of the same material as the first pixel electrode 31, so that the first pixel electrode 31 and the second pixel electrode 32 are provided on the same layer and can be formed simultaneously, which helps to simplify the manufacturing process of the array substrate 100 and save manufacturing cost.

The thin film transistors 2 can be provided in various ways, two adjacent thin film transistors 2 can be provided in proximity, or can be provided symmetrically with respect to the second pixel electrode 32, etc., which is not limited in the present application. Referring to FIG. 3, two adjacent thin film transistors 2 are provided in proximity, and two adjacent first pixel electrodes 31 are merged to be formed integratedly, so that two adjacent first pixel electrodes 31 form a whole, and the signal line 73 can be connected to two first pixel electrodes 31 simultaneously to reduce the number of the signal lines 73, thus to simplify the process.

Since a larger distance between the first pixel electrode 31 and the second pixel electrode 32 will affect the display effect of the electronic paper, and a smaller distance will easily be electrically penetrated, thus in the embodiment, a distance between the first pixel electrode 31 and the second pixel electrode 32 is L, where the L is greater than or equal to 4 and less than or equal to 6 to separate the first pixel electrode 31 and the second pixel electrode 32 from each other, to avoid the first pixel electrode 31 and the second pixel electrode 32 from being electrically penetrated and to prevent the first pixel electrode 31 and the second pixel electrode 32 from influencing each other. The L is equal to 5 $\mu m$.

In an embodiment, the active layer 23 is made of a metal oxide semiconductor material, an amorphous silicon material or a polycrystalline silicon material. The metal oxide semiconductor material includes indium gallium zinc oxide (IGZO), indium zinc oxide (IZO), zinc oxide (ZnO) or gallium zinc oxide (GZO), etc., and the polycrystalline silicon material may be high temperature polycrystalline silicon or low temperature polycrystalline silicon, etc.

The active layer 23 can be a single-layer structure, or a multi-layer structure, etc., which is not limited in the present application. In the embodiment, the active layer 23 includes two doped semiconductor layers 231, the two doped semiconductor layers 231 are correspondingly connected to the source 21 and the drain 22. Two ends of the semiconductor layer 232 are respectively connected to two doped semiconductor layers 231. Since two doped semiconductor layers 231 are provided, the conductivity of the active layer 23 is enhanced to increase the contact conductivity of the semiconductor layer 232 with the source 21 and the drain 22, thus to increase the turn-on current of the thin film transistor 2.

It will be understood that when the selected material meets the conductive requirement of the semiconductor layer 232 with the source 21 and the drain 22, a structure without the doped semiconductor layer 231 can also be used.

In order to reduce the probability that the voltage loaded on the pixel electrode structure 3 allows the generation of leakage currents in the thin film transistor 2 in the off state, it is necessary to ensure that the thickness of the insulation layer between the pixel electrode structure 3 and the thin film transistor 2 is large. Based on this, in the embodiment, the array substrate 100 further includes a protective layer 4 and a flat layer 5, the protective layer 4 is provided on the side of the thin film transistor 2 away from the substrate 1, and the flat layer 5 is provided on a side of the protective layer 4 away from the substrate 1. Since a thin protective layer 4 and a thicker flat layer 5 are provided in layers, not only the distance between the thin film transistor 2 and the pixel electrode structure 3 is increased to avoid leakage currents in the thin film transistor 2, and but also it keeps flat on the thin film transistor 2 for easily setting the pixel electrode structure 3.

Referring to FIG. 1, the array substrate 100 further includes a common electrode 6, the common electrode 6 is located on the same layer as the source 21 or the drain 22. The common electrode 6 is partially overlapped with the pixel electrode to form a storage capacitor (Cst), such that the manufacturing process can be simplified and the manufacturing cost can be reduced.

Based on the above hardware structure, the present application provides an embodiment of a control method of the array substrate 100.

FIG. 7 is a flowchart of a control method of the array substrate 100 according to an embodiment of the present application.

In an embodiment, a control method of the array substrate 100 includes:

S10: obtaining a light intensity parameter of an environment where the array substrate 100 is located.

In the embodiment, since the array substrate 100 has different effects on the channel of the thin film transistor 2 in different environments, when the light intensity of the environment is high, such as when the electronic paper is used outdoors, the external light easily passes through the electrophoretic layer into the channel to generate the leakage current, and when the light intensity of the environment is low, such as when the electronic paper is used indoors, the external light does not easily pass through the electrophoretic layer into the channel of the thin film transistor 2 to generate the leakage current, so the light intensity parameters of the environment where the array substrate 100 is located are obtained to identify the light intensity of the environment.

S20: determining a driving strategy of the pixel electrode structure 3 based on the light intensity parameter.

In the embodiment, when the light intensity of the environment is high, the external light easily passes through the electrophoretic layer into the channel of the thin film transistor 2 to generate the leakage current, at this time, it is necessary to adjust the first pixel electrode 31 to make the electronic ink on the first pixel electrode 31 to be in a black state to prevent the external light from irradiating into the channel of the thin film transistor 2, and when the light intensity of the environment is low, the external light does not easily irradiate into the channel of the thin film transistor 2, at this time, the first pixel electrode 31 does not need to keep the electronic ink on the first pixel electrode 31 in a black state, but can be cooperated with the second pixel electrode 32 for displaying images, thus to enhance the display effect of the electronic paper, so that according to the light intensity parameter, it is determined whether the external light can easily irradiate into the channel of the thin film transistor 2 or not, to determine the driving strategy of the pixel electrode structure 3.

In an embodiment, referring to FIG. 8, in order to determine the driving scheme of the pixel electrodes, in an embodiment, after S10, the method further includes:

S21: in response to that the light intensity parameter is greater than or equal to a preset value, inputting two independent driving signal parameters to the signal line 73 and the data line 72, to make the first pixel electrode 31 drive electronic ink on the first pixel electrode 31 to be in a black state and make the second pixel electrode 32 drive the electronic ink on the second pixel electrode 32 to display an image.

In the embodiment, when the light intensity parameter is greater than or equal to a preset value, it is determined that the electronic paper is outdoors and the external light easily irradiates into the channel of the thin film transistor 2 to generate the leakage current, at this time, two independent driving signal parameters are input to the signal line 73 and the data line 72, to make the first pixel electrode 31 and the second pixel electrode 32 to respectively drive the electronic ink thereon, so that the electronic ink on the first pixel electrode 31 is in a black state to avoid the external light from irradiating into the channel of the thin film transistor 2, and the electronic ink on the second pixel electrode 32 displays an image.

It is to be noted that the preset value may be a fixed value, or a range of values, etc., which is not limited in the present application.

In another embodiment, referring to FIG. 9, after S10, the method further includes:

S22: in response to that the light intensity parameter is less than a preset value, inputting two same driving signal parameters to the signal line 73 and the data line 72, to drive the first pixel electrode 31 and the second pixel electrode 32 simultaneously, to drive the electronic ink on the first pixel electrode 31 and the second pixel electrode 32 to display the image simultaneously.

In the embodiment, when the light intensity parameter is less than the preset value, it is determined that the electronic paper is indoors and the external light does not easily irradiate into the thin film transistor 2, at this time, two same driving signal parameters are input to the signal line 73 and the data line 72, to drive the first pixel electrode 31 and the second pixel electrode 32 simultaneously, so that the first pixel electrode 31 is not used to shield the light but to display the image, thereby enabling the first pixel electrode 31 and the second pixel electrode 32 to simultaneously drive the electronic ink thereon to display the image, to enhance the display effect of the electronic paper.

Figure 10:
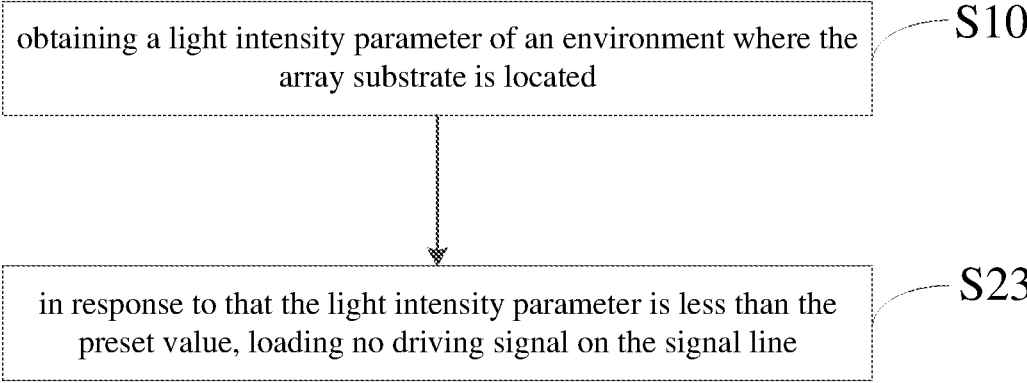
FIG. 10 is a flowchart of the control method of the array substrate according to a fourth embodiment of the present application.

It should be noted that there are various driving strategies of the pixel electrode structure 3, and in other embodiments, referring to FIG. 10, after S10, the method further includes:

S23: in response to that the light intensity parameter is less than the preset value, loading no driving signal on the signal line 73.

In the embodiment, when the light intensity parameter is less than the preset value, it is determined that the electronic paper is indoors and the external light does not easily irradiate into the thin film transistor 2, at this time, the driving signal is no longer loaded on the signal line 73, to make the first pixel electrode 31 to stop driving the electronic ink on the first pixel electrode 31, to reduce the energy consumption of the array substrate 100, thus to enhance the usage time of the electronic paper.

In addition, the present application provides a manufacturing method of the array substrate 100, which can be used to manufacture the array substrate 100 as described in the above embodiments. Referring to FIG. 5, the manufacturing method of the array substrate 100 includes:

S30: depositing the thin film transistor 2 on a substrate 1, the thin film transistor 2 includes a gate 24, the source 21, the drain 22, and the active layer 23 provided between the source 21 and the drain 22.

The method to form the thin film transistor 2 includes:

Forming the gate 24, forming a first conductive layer on the substrate 1 and patterning the first conductive layer by using a first conformation pattern process to form the gate 24. The first conductive layer is a metal layer, which can be made of aluminum or aluminum alloy, copper or copper alloy, etc. In addition, the substrate 1 can be a rigid substrate such as a glass substrate, a plastic substrate, or a bendable flexible substrate, such as a substrate made of polyethylene terephthalate (PET), polyethersulfone (PES), polycarbonate (PC) or polyimide (PI) and derivatives thereof.

Forming an insulation layer of the gate and an active layer 23, forming the insulation layer on the gate 24, and forming the semiconductor layer 232 on the insulation layer of the gate 24, and patterning the semiconductor layer 232 by using a conformation pattern process to form an active layer 23. The protective layer 4 of the gate 24 is mainly used to insulate the gate electrode from the other patterns on the gate electrode to protect the gate electrode. The active layer 23 may be made of a semiconductor material such as a metal oxide semiconductor material, an amorphous silicon material, or a polycrystalline silicon material. For example, the active layer 23 can be made of a metal oxide semiconductor material such as indium gallium zinc oxide (IGZO), indium zinc oxide (IZO), zinc oxide (ZnO) or gallium zinc oxide (GZO). The polysilicon material can be high temperature polysilicon or low temperature polysilicon. The insulation layer of the gate 24 can be inorganic insulation layer, such as silicon oxide, silicon nitride, silicon nitride and other materials.

Forming the source 21, the drain 22 and the common electrode 6, forming the second conductive layer on the active layer 23, and patterning the second conductive layer to form the source 21, the drain 22 and the common electrode 6 by the conformation pattern process.

The second conductive layer is made of molybdenum, titanium, aluminum, copper and alloy thereof and other metal materials. The conformation pattern process involved in the embodiment typically includes operations such as coating photoresist, exposure development, etching, and removal of the photoresist. In S12, for example, the conformation pattern process includes: coating the insulation layer film of the gate with photoresist; then, using a mask to expose and develop the photoresist to form a photoresist pattern that includes a photoresist completely removed area and a photoresist completely retained area, where the photoresist completely removed area is where a through hole is formed on; then, using a dry etching process to etch the insulation layer film of the gate in the photoresist completely removed area to form the through hole. Since the insulation layer of the gate is used to cover the entire first substrate 1 to insulate the gate electrode from the pattern in the lower layer of the gate electrode, i.e., the insulation layer film of the gate in the rest of the area does not need to be etched except for the area where the through hole is etched out, the insulation layer of the gate is formed while the through hole is etched out. The above is a specific embodiment of the conformation pattern process described in the embodiments of the present application.

S50: sequentially depositing on the substrate 1 a protective layer 4 and an insulation layer covering the thin film transistor 2, and making an opening hole in the protective layer 4 and the insulation layer to expose a portion of the drain 22;

S60: depositing the pixel electrode structure 3 on the insulation layer, where the pixel electrode structure includes a first pixel electrode 31 and a second pixel electrode 32 provided correspondingly to the conductive channel of the thin film transistor 2, the pixel electrode structure is electrically connected to the drain 22 through the opening hole, and the first pixel electrode 31 is covered on the active layer 23.

In the manufacturing method of the array substrate 100 of the embodiment, the array substrate 100 is formed by the above steps, the first pixel electrode 31 is located on the conductive channel, which can shield the irradiation of ambient light to the conductive channel, to avoid the conductive channel from generating leakage current due to light exposure, to reduce the impact of leakage current on the display performance of the array substrate 100, and to improve the display quality of the array substrate 100, and in the embodiment, the first pixel electrode 31 and the second pixel electrode 32 are formed simultaneously, which can simplify the manufacturing process of the array substrate 100 and save manufacturing cost.

The present application also provides an electronic paper display device 1000, the electronic paper display device 1000 includes the above array substrate 100. It is to be noted that the structure of the array substrate 100 in the electronic paper display device 1000 can be referred to the above embodiment of the array substrate 100, which will not be repeated here. Since the above array substrate 100 is used in the electronic paper display device 1000 provided in the present application, the embodiment of the electronic paper display device 1000 provided in the present application includes all the technical solutions of all the embodiments of the above array substrate 100, and the technical effects achieved are exactly the same, which will not be repeated here.

In an embodiment, referring to FIG. 4, the electronic paper display device 1000 further includes an opposite substrate and an electrophoretic layer, the opposite substrate is provided at an interval with the array substrate 100, the electrophoretic layer is provided between the array substrate 100 and the opposite substrate, where an upper electrode 8 on the opposite substrate cooperates with the first pixel electrode 31 and the second pixel electrode 32 on the array substrate 100 to control the electrophoresis of the charged particles in the microcapsules in the electrophoretic layer, to make the microcapsules in the electrophoretic layer on the first pixel electrode 31 to be in a black state, to achieve a light-shielding effect.

It is to be noted that the opposite substrate and the array substrate 100 may be a rigid substrate such as a glass substrate, a plastic substrate, or a bendable flexible substrate such as a substrate made of polyethylene terephthalate (PET), polyethersulfone (PES), polycarbonate (PC) or polyimide (PI) and derivatives thereof.

The above is only an embodiment of the present application and is not to limit the scope of the present application.

Any equivalent structural transformation made by using the contents of the specification of the present application and the accompanying drawings under the conception of the present application or direct/indirect application in other related technical fields is included in the scope of the present application.

What is claimed is:

1. A control method based on an array substrate, wherein:
    the array substrate is applied on an electronic paper display device, and comprises a substrate, a plurality of thin film transistors provided on the substrate, and a plurality of pixel electrode structures provided on a side of the thin film transistors away from the substrate;
    each thin film transistor comprising an active layer, a source and a drain, a conductive channel being provided between the source and the drain and being provided on the active layer;
    each pixel electrode structure comprises a first pixel electrode and a second pixel electrode spaced from each other, the first pixel electrode corresponds to the conductive channel and is connected to a signal line, and the second pixel electrode is connected to the drain through a conductive through hole, and
    wherein the control method based on the array substrate comprises:
    obtaining a light intensity parameter of an environment where the array substrate is located; and
    determining a driving strategy of the pixel electrode structure based on the light intensity parameter.

2. The control method according to claim 1, wherein the drain is connected to a data line through the active layer, the determining the driving strategy of the pixel electrode structure based on the light intensity parameter comprises:
    in response to that the light intensity parameter is greater than or equal to a preset value, inputting two independent driving signal parameters to the signal line and the data line, to make the first pixel electrode drive electronic ink on the first pixel electrode to be in a black state and make the second pixel electrode drive electronic ink on the second pixel electrode to display an image; and
    in response to that the light intensity parameter is less than the preset value, inputting two same driving signal parameters to the signal line and the data line, to drive the first pixel electrode and the second pixel electrode simultaneously, to drive the electronic ink on the first pixel electrode and the second pixel electrode to display the image simultaneously.

3. The control method according to claim 1, wherein the drain is connected to a data line through the active layer, the determining the driving strategy of the pixel electrode structure based on the light intensity parameter comprises:
    in response to that the light intensity parameter is greater than or equal to a preset value, inputting two independent driving signal parameters to the signal line and the data line, to make the first pixel electrode drive electronic ink on the first pixel electrode be in a black state and make the second pixel electrode to drive electronic ink on the second pixel electrode to display an image; and
    in response to that the light intensity parameter is less than the preset value, loading no driving signal on the signal line.

* * * * *